(12) United States Patent
Evoy et al.

(10) Patent No.: US 6,208,172 B1
(45) Date of Patent: Mar. 27, 2001

(54) SYSTEM MARGIN AND CORE TEMPERATURE MONITORING OF AN INTEGRATED CIRCUIT

(75) Inventors: David R. Evoy; Nicholas J. Richardson, both of Tempe, AZ (US)

(73) Assignee: VLSI, Technology, Inc., San Jose, CA (US)

( * ) Notice: Subject to any disclaimer, the term of this patent is extended or adjusted under 35 U.S.C. 154(b) by 0 days.

(21) Appl. No.: 08/372,423

(22) Filed: Jan. 13, 1995

(51) Int. Cl.[7] ................................................ G01R 25/00
(52) U.S. Cl. ...................................... 327/12; 327/3; 327/7
(58) Field of Search ......................... 327/31, 35, 1, 327/2, 3, 5, 7, 12; 324/617, 76.77, 621, 73.1, 158 R; 371/22.1, 22.3, 22.4, 22.5, 25.1; 368/113, 118, 117, 120

(56) References Cited

U.S. PATENT DOCUMENTS

| | | | |
|---|---|---|---|
| 4,506,175 | * 3/1985 | Reitmeier et al. | 307/525 |
| 4,520,319 | * 5/1985 | Baker | 328/133 |
| 4,858,208 | * 8/1989 | Swapp | 368/118 |
| 5,181,191 | * 1/1993 | Farwell | 368/113 |
| 5,245,291 | * 9/1993 | Fujimura | 324/617 |
| 5,291,141 | * 3/1994 | Farwell et al. | 324/617 |
| 5,293,080 | * 3/1994 | Hiwada et al. | 307/260 |
| 5,325,053 | * 6/1994 | Gasbarro et al. | 324/158 R |
| 5,365,527 | * 11/1994 | Honma | 371/25.1 |
| 5,374,900 | * 12/1994 | Masumoto | 331/1 A |
| 5,513,152 | * 4/1996 | Cabaniss | 368/118 |

* cited by examiner

*Primary Examiner*—Kenneth B. Wells
(74) *Attorney, Agent, or Firm*—Douglas L. Weller

(57) ABSTRACT

A circuit monitor performance of an integrated circuit. The circuit includes a clock signal and a phase delay detection circuit. The clock signal is used by the integrated circuit to generate an output signal on an output pin of the integrated circuit. The phase delay detection circuit detects relative phase difference between the clock signal and the output signal on the output pin of the integrated circuit. The phase delay detection circuit includes a digital signal generator and an integrator. The digital signal generator is connected to an output pin of the integrated circuit. The digital signal generator generates a digital signal. Changes in phase delay between the output signal on the output pin of the integrated circuit and the clock signal used by the integrated circuit are encoded in a duty cycle of the digital signal generated by the digital signal generator. The integrator is connected to the digital signal generator and integrates the digital signal to produce an integrated signal. A voltage level of the integrated signal indicates relative phase delay between the output signal and the clock signal.

14 Claims, 9 Drawing Sheets

SYSTEM MARGIN AND CORE TEMPERATURE MONITORING OF AN INTEGRATED CIRCUIT

BACKGROUND

The present invention concerns the monitoring of the system margin of an integrated circuit. The technique presented herein may also be used to monitor the core temperature of the integrated circuit.

The propagation delay of signals in integrated circuits is affected by many factors. These include the voltage level of VCC, process variations in production of the integrated circuit, system variations (such as input and output capacitance to the integrated circuit) and temperature.

In order to assure that timing within an integrated circuit is adequate, a system margin for the integrated circuit is utilized. That is, rather than designing output signals of the integrated circuit to be available at the last possible instant, the integrated circuit is designed so that, under optimal operating conditions, the signals arrive at the destination early. This early arrival allows for delays introduced by adverse circumstances, such as a lowered VCC, an increase in temperature and unfavorable processing variations. Thus integrated circuits are generally designed to operate sufficiently even under non-optimal conditions.

However, the trend over time in designing integrated circuits is to continue to provide integrated circuits with lower VCC and faster operating frequency. It would be advantageous therefore for purchasers of integrated circuits to be able to measure the system margin built in by the manufacturer for the purpose of evaluation and possibly to adjust the operating parameters of the integrated circuit to, where desirable, change the system margin.

In addition, in many high performance integrated circuits, operation of the integrated circuit can result in the generation of a significant amount of heat. If the amount of heat is not limited or adequately dissipated, performance of the integrated circuit can be significantly impeded and/or circuitry within the integrated circuit can be destroyed.

In order to avoid overheating integrated circuits, the integrated circuits and the system containing the integrated circuits can be designed so that even under worst case operating conditions there will not be significant enough accumulation of heat to overheat the integrated circuit. However, this over design will result in integrated circuits which will have an overabundance of system margin and which will not perform optimally under normal operating conditions.

Alternatively, some way can be devised to try to determine the temperature of the integrated circuit. For instance, this could be done by measuring the temperature on the casing of the processor chip using a thermistor or similar technique. Alternatively, a software routine can be used to monitor operation of the integrated circuit, and based on past and current operations estimating the temperature of the integrated circuits. One problem with all these methods of monitoring temperature is that they are extremely inaccurate. Additionally, the added circuitry/software may be expensive to implement.

SUMMARY OF THE INVENTION

In accordance with the preferred embodiment of the present invention, a circuit is presented for monitoring performance of an integrated circuit. The circuit is useful for monitoring both system margin and core operating temperature of the integrated circuit.

The circuit includes a clock signal and a phase delay detection circuit. The clock signal is used by the integrated circuit to generate an output signal on an output pin of the integrated circuit. The phase delay detection circuit detects relative phase difference between the clock signal and the output signal on the output pin of the integrated circuit.

The phase delay detection circuit includes a digital signal generator and an integrator. The digital signal generator is connected to an output pin of the integrated circuit. The digital signal generator generates a digital signal. Changes in phase delay between the output signal on the output pin of the integrated circuit and the clock signal used by the integrated circuit are encoded in a duty cycle of the digital signal generated by the digital signal generator.

The integrator is connected to the digital signal generator and integrates the digital signal to produce an integrated signal. A voltage level of the integrated signal indicates relative phase delay between the output signal and the clock signal.

In one embodiment, the digital signal generator includes a delay flip-flop and a gate. The delay flip-flop has a D input, a clock input and a Q output, the clock signal is connected to the clock input and the output signal is connected to the D input. The gate has a signal input, a control input and an output. The output signal is connected to the signal input. The Q output is connected to the control input of the gate. The output is connected to an input of the integrator. The integrator includes a resistor and a capacitor. The resistor has a first end connected to the output of the gate. The capacitor has a first end connected to a second end of the resistor. The capacitor also has a second end connected to a reference voltage. An analog to digital converter may be connected to the first end of the capacitor.

In this first embodiment only the falling edge of the output signal on the output pin is utilized in deriving the voltage of the integrated signal. In a second embodiment, both the falling edge and the rising edge of the output signal on the output pin are utilized to derive the voltage on the integrated signal. This increases the number of samples of the output signal on the output pin when compared with the first embodiment. However, the second embodiment uses more components, i.e., a delay flip-flop, two NAND gates and two gates, to implement the digital signal generator. Additionally, in various embodiments, more sophisticated integrators can be used to limit noise.

Additionally, in one disclosed embodiment of the present invention, the phase detection circuit includes a controller which changes an operating frequency of the integrated circuit when the voltage level of the integrated signal indicates that the phase delay between the output signal and the clock signal is longer than a predetermined value. This can be used to adjust system margin "on-the-fly" so as to assurance optimal performance of the integrated circuit.

The present invention also allows monitoring, and thus adjustment, of operating (or system) margins within an integrated circuit through monitoring phase delay of an output signal. By observing system margin, the integrated circuit can be operated at a frequency that never violates the system timing requirements regardless of conditions. This accommodates all possible worst case conditions without sacrifice to nominal operating conditions.

By monitoring phase delay of integrated circuits and adjusting operating parameters in response to excessive phase delay, it is possible to operate integrated circuits at an operating frequency which is beyond the manufacturers specified maximum frequency conditions and is optimal for the particular operating conditions.

Further, monitoring of phase delay of output signals as taught by the present invention is useful as a manufacturing aid. If system margin is detected to be below normal at ambient temperature, this indicates the system may fail when heated. Thus, using the teaching of the present invention to exactly test system margin at an ambient temperature allows a prediction of system margin at higher temperature. This reduces the need to actually test the system in a heat chamber.

In addition, various embodiments of the present invention allow for a means to monitor the internal temperature within an integrated circuit. This information allows the lowering of operating frequency of the integrated circuit when the integrated circuit is at a temperature which is above a predetermined temperature limit.

DESCRIPTION OF THE PREFERRED EMBODIMENT

Figure 1:
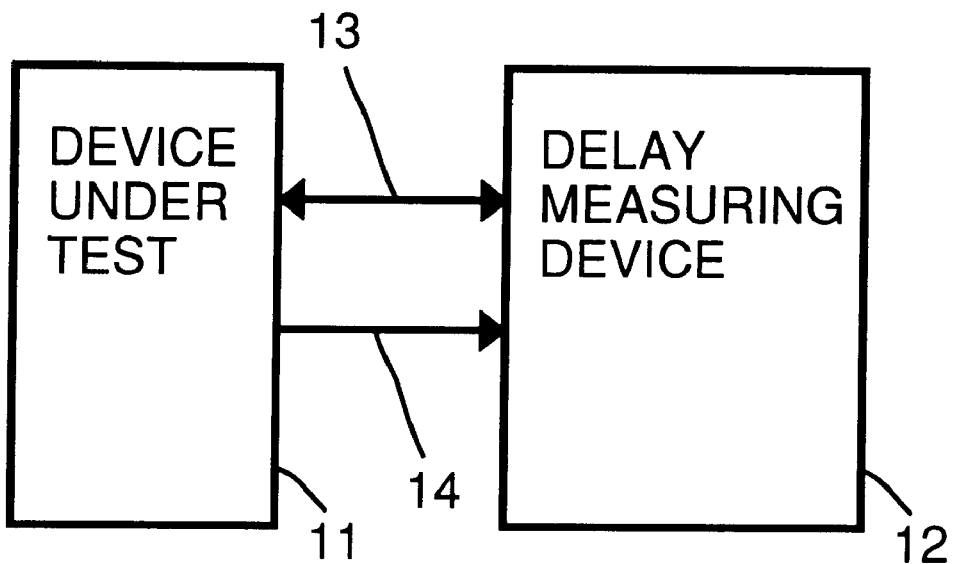
FIG. 1 shows a block diagram of a system in which signal delay through an integrated circuit is monitored in accordance with a preferred embodiment of the present invention.

FIG. 1 shows a block diagram of a system in which signal delay through a device under test (DUT) 11 is measured by a delay measuring device 12, in accordance with a preferred embodiment of the present invention. A clock signal on a clock line 13 is used by both DUT 11 and delay measuring device 12. Delay measuring device 12 uses the clock signal to measure an amount of delay introduced by DUT 11 to an output signal on an output pin 14.

For example, DUT 11 is a Pentium processor available from Intel Corporation, having a business address of 3065 Bowers Ave., Santa Clara, Calif. 95051. For example, the output signal on output pin 14, is the ADS# signal on a Pentium processor. In the preferred embodiment, the Pentium processor is in a fixed loop and has its interrupts turned off when measuring the output signal on output pin 14. This is done in order to eliminate the possibility that the output signal on output pin 14 is varying with logic state within DUT 11.

Figure 2:
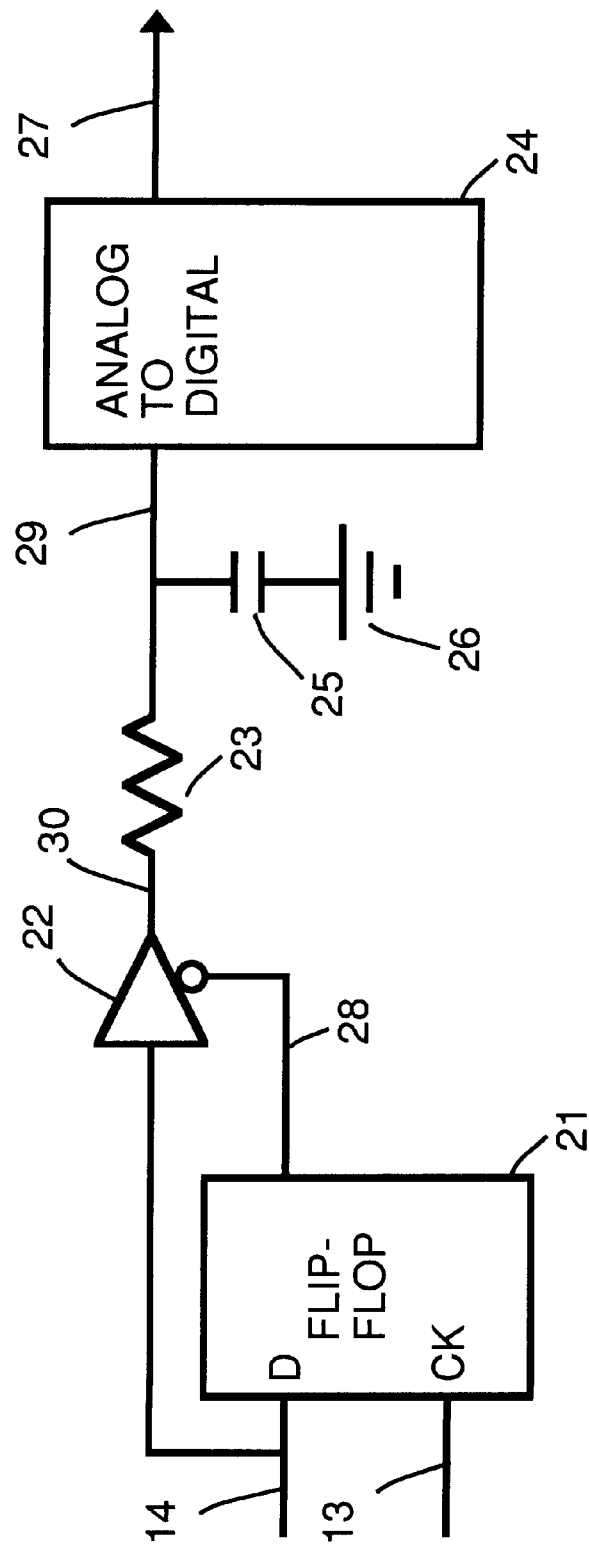
FIG. 2 shows a block diagram of circuitry which performs signal delay monitoring through an integrated circuit in accordance with a preferred embodiment of the present invention.

FIG. 2 shows an embodiment of delay measuring device 12. A flip-flop 21 serves to provide a single clock cycle delay to the output signal on output pin 14 in order to produce a delayed signal on a line 28. A gate 22 is controlled by the delayed signal on line 28. When gate 22 allows the output signal on output pin 14 to pass through, the output signal charges an integrator consisting of a resistor 23 and a capacitor 25 connected to ground 26, as shown. For example, resistor 23 has a resistance of 10 kilohms. Capacitor 25 has a capacitance of 0.1 microfarads. The operating frequency of the clock signal is, for example 33 megahertz. The integrator integrates a gated signal on a line 30 to produce an integrated signal on a line 29.

An analog to digital converter 24 is used to convert the integrated signal on line 29 to a digital signal on an output line 27. The digital signal on output line 27 is used by the system to, for example, determine system margin or as a temperature control feedback signal, as will be described in further detail below.

Figure 4:
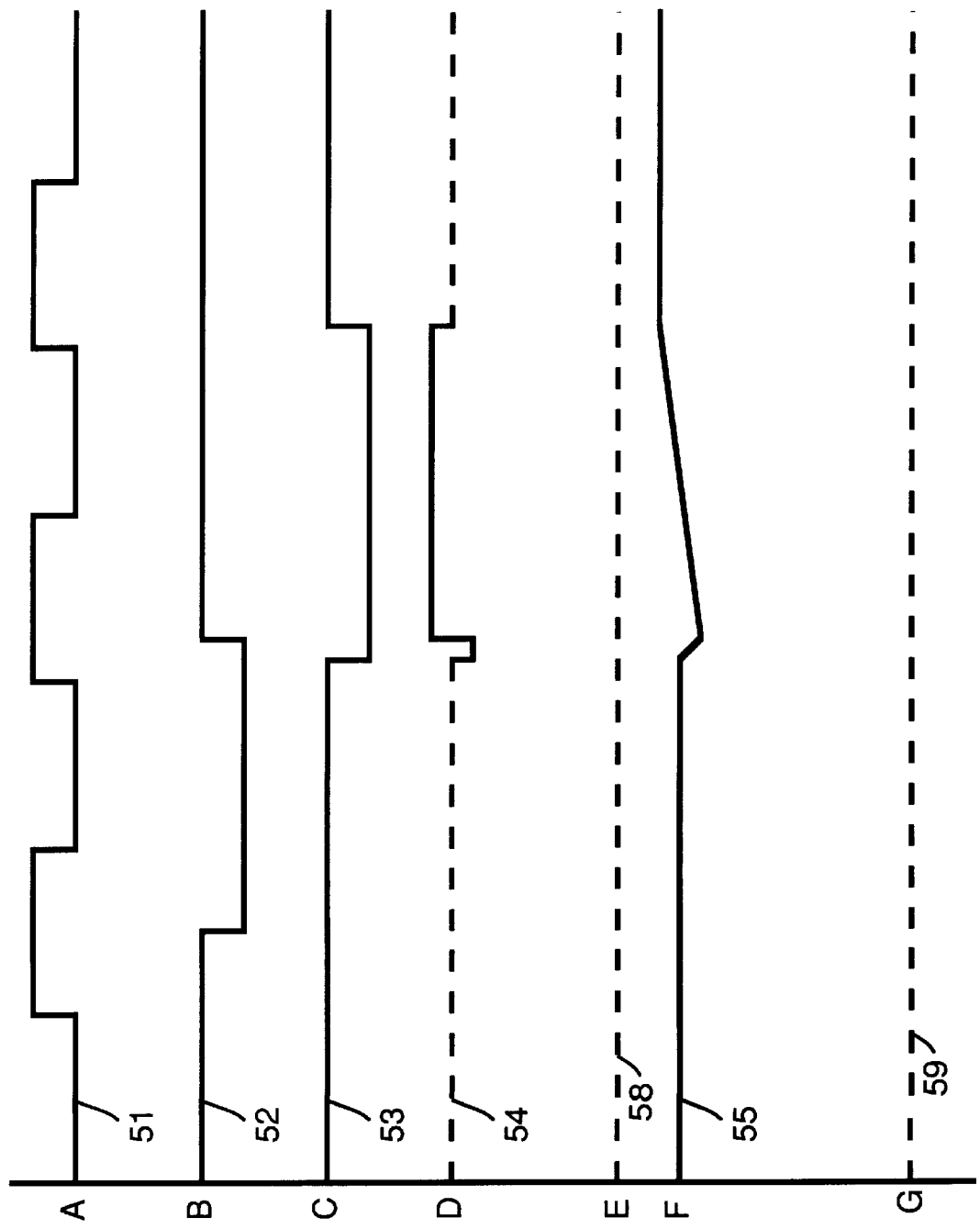
FIGS. 4, 5, 6 and 7 show timing diagrams for the circuitry shown in FIG. 2 in accordance with the preferred embodiment of the present invention.

FIGS. 4, 5, 6 and 7 show timing diagrams for the circuitry shown in FIG. 2 in accordance with the preferred embodiment of the present invention. In FIG. 4, a waveform 51 shows the timing for the clock signal on clock line 13. A waveform 52 shows the timing for the output signal on output pin 14. A waveform 53 shows the timing for the delayed signal on line 28. A waveform 54 shows the timing for the gated signal on line 30. A waveform 55 shows the timing for the integrated signal on line 29. Waveform 55 also shows the voltage of the integrated signal on line 29 relative to VCC represented by a line 58 and ground represented by a line 59. In FIGS. 4 through 7, the changes in voltage of the integrated signal on line 29 relative to VCC represented by a line 58 and ground represented by line 59 are exaggerated to illustrate operation of the present invention.

In the example used to describe the preferred embodiment, the falling edge of the output signal on output pin 14 is required to occur after the rising edge of the clock signal and before the falling edge of the clock signal. Likewise, the rising edge of the output signal on output pin 14 is required to occur after the rising edge of the clock signal and before the falling edge of the clock signal. For operating conditions represented by FIG. 4, there is a significant system margin as illustrated by the rising edge of waveform 52 for the output signal on output pin 14 rising significantly before the falling edge of the clock signal represented by waveform 51. This high system margin could result from a high system margin being designed into the system, favorable processing parameters and/or some combination of favorable operating parameters, such as low operating temperature and high VCC voltage level.

The resulting waveform 54 for the gated signal on line 30 illustrates that the integrator will charge capacitor 25 to a voltage which is relatively closer to VCC than to ground, as represented by waveform 55 for the integrated signal on line 29.

Figure 5:
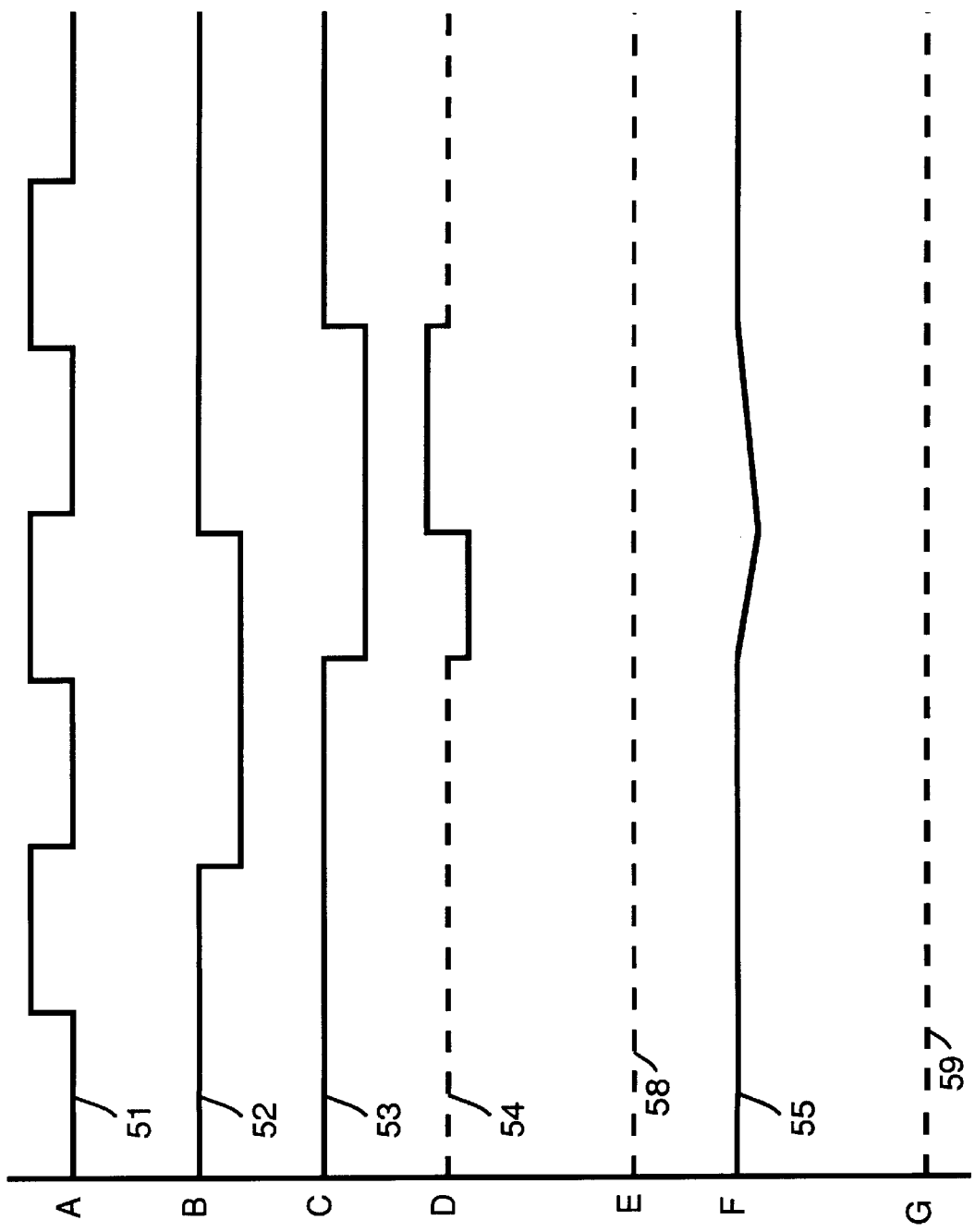
Figure 6:
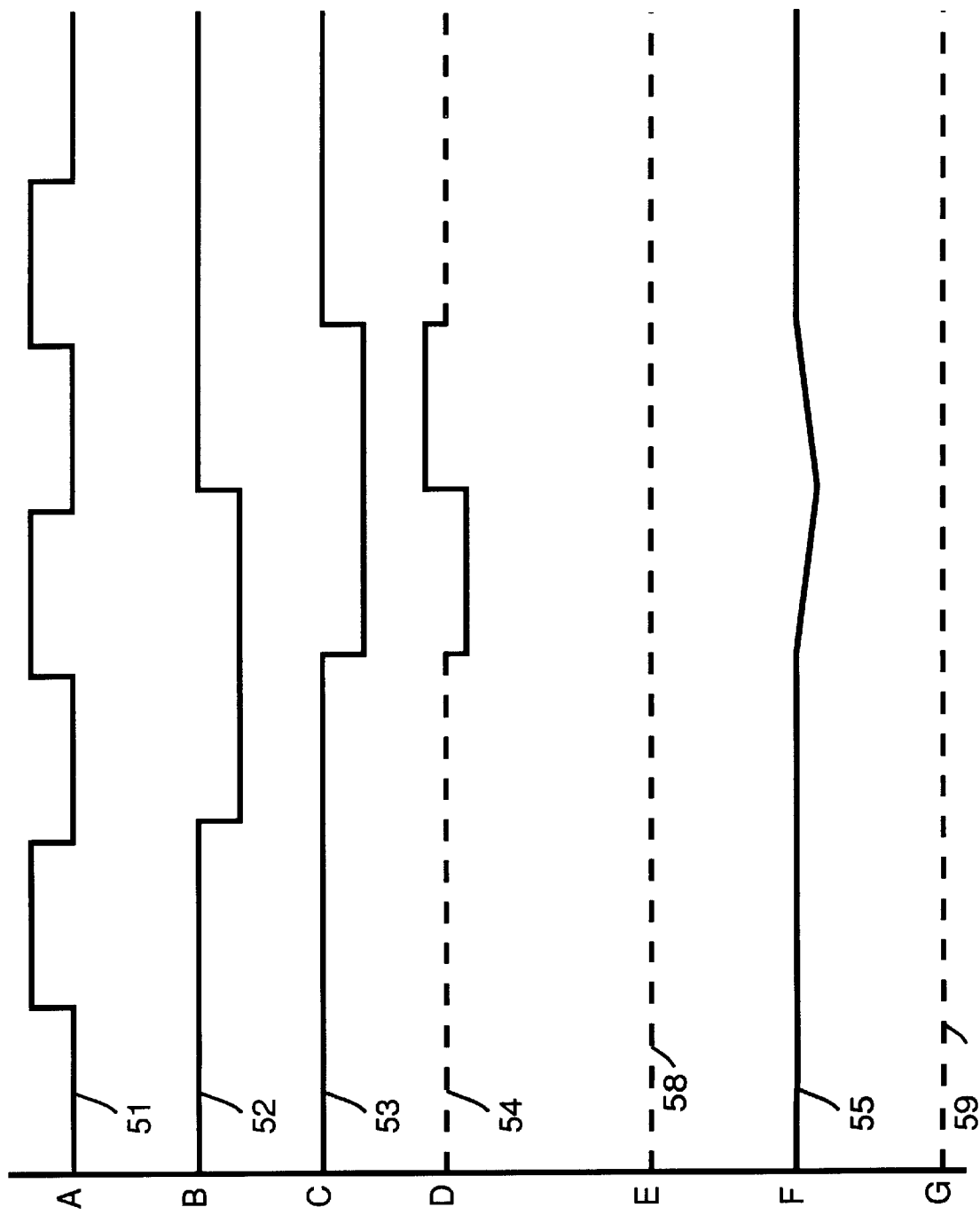
Figure 7:
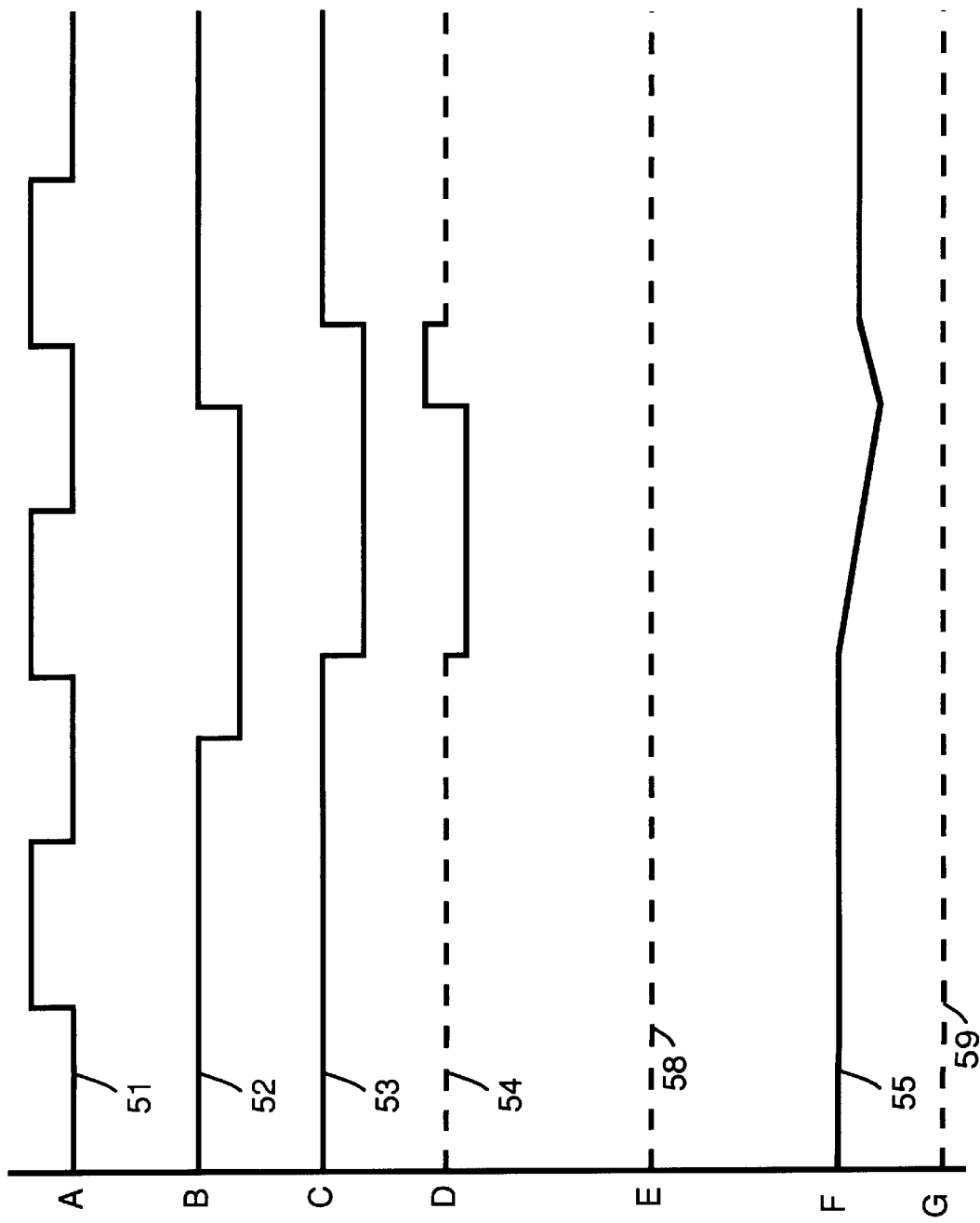

In FIGS. 5, 6 and 7 as in FIG. 4, waveform 51 shows the timing for the clock signal on clock line 13. Waveform 52 shows the timing for the output signal on output pin 14. Waveform 53 shows the timing for the delayed signal on line 28. Waveform 54 shows the timing for the gated signal on line 30. Waveform 55 shows the timing for the integrated signal on line 29. As discussed above, waveform 55 also shows the voltage of the integrated signal on line 29 relative to VCC represented by a line 58 and ground represented by line 59. In FIGS. 5 through 7, the changes in voltage of the integrated signal on line 29 relative to VCC represented by a line 58 and ground represented by line 59 are exaggerated to illustrate the present invention.

For operating conditions represented by FIG. 5, the falling edge of the output signal on output pin 14 occurs relatively closer to the falling edge of the clock signal on clock line 13, than for the operating conditions represented by FIG. 4. Likewise, the rising edge of the output signal on output pin 14 occurs relatively closer to the falling edge of the clock signal on clock line 13, than for the operating conditions represented by FIG. 4. This indicates that the system margin has been reduced, for example, by a change in operating parameters, such as increased operating temperature and/or reduced VCC voltage level.

The resulting waveform 54 for the gated signal on line 30 is positive for a shorter duration than for the operating conditions represented by FIG. 4. Also, the resulting waveform 54 for the gated signal on line 30 is negative for a longer duration than for the operating conditions represented by FIG. 4. This will result in the integrator charging capacitor 25 to be charged less, and there will be a gradual decrease in voltage across the capacitor, as represented by waveform 55 for the integrated signal on line 29.

For operating conditions represented by FIG. 6, the falling edge of the output signal on output pin 14 occurs right at the falling edge of the clock signal on clock line 13. Likewise, the rising edge of the output signal on output pin 14 occurs right at the falling edge of the clock signal on clock line 13. This indicates that there is no remaining system margin. This operating system could result from adverse operating parameters, such as increased operating temperature and/or reduced VCC voltage level.

The resulting waveform 54 for the gated signal on line 30 is about half the time positive and half the time negative. This will result in the integrator charging capacitor 25 to be about half way between VCC and ground, as represented by waveform 55 for the integrated signal on line 29.

For operating conditions represented by FIG. 7, the falling edge of the output signal on output pin 14 occurs after the falling edge of the clock signal on clock line 13. Likewise, the rising edge of the output signal on output pin 14 occurs after the falling edge of the clock signal on clock line 13. This indicates that the integrated circuit no longer is within the specified delay requirements. This will likely result in a system failure.

The waveform 54 for the gated signal on line 30 is more often negative than positive. This will result in the integrator discharging capacitor 25, and there will be a gradual decrease in voltage across the capacitor, as represented by waveform 55 for the integrated signal on line 29.

The actual voltages shown in FIG. 4 through 7 are not to scale. Particularly, the DC component of the voltage for the integrated signal on line 29, for some circuits, may differ only slightly (i.e., by hundreds of millivolts) over a range of various operating parameters for DUT 11, dependent, for example, on the frequency of occurrence of transitions of the output signal on output pin 14. A more complex filter, for example, could be used if desired to increase the ability to detect the voltage changes for the integrated signal on line 29. Also, resolution could be improved by using different output pin signal with a minimum delay over the entire clock period. As discussed above, the output signal on output pin 14 is required to transition during the first half of the clock cycle.

Figure 3:
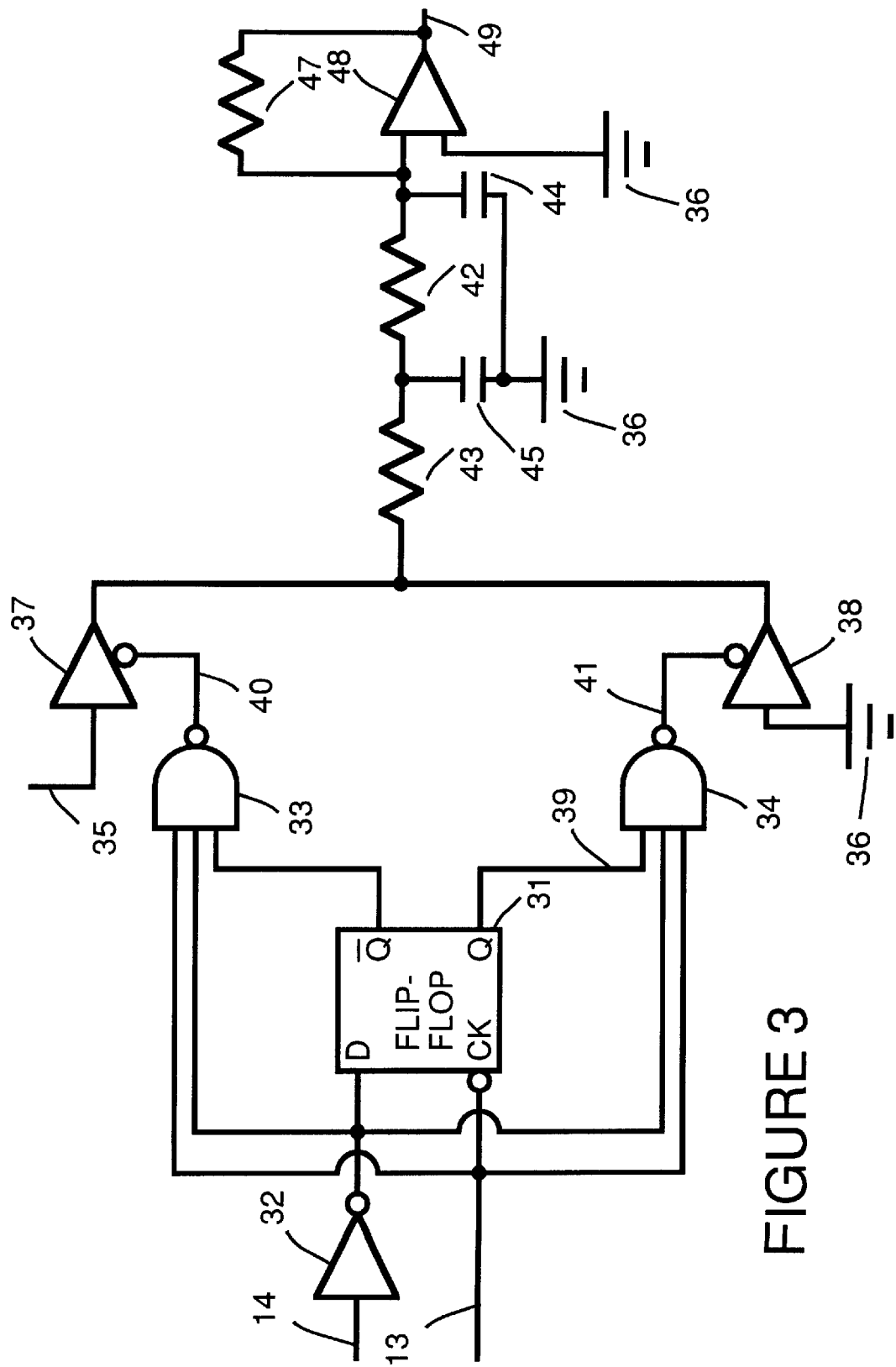
FIG. 3 shows a block diagram of circuitry which performs signal delay monitoring through an integrated circuit in accordance with an alternate preferred embodiment of the present invention.

FIG. 3 shows an alternative embodiment of circuitry which monitors delay of the output signal on output pin 14. In the embodiment shown in FIG. 3, delay in transition of both the falling edge and the rising edge of the output signal on output pin 14 is utilized in deriving the voltage on an integrated signal on line 49. This increases the number of samples of the output signal on output pin 14 when compared with the circuitry in FIG. 2. For the circuitry shown in FIG. 2, only the falling edge of the output signal on output pin 14 is utilized in deriving the voltage of the integrated signal on line 29.

A flip-flop 31 serves to provide a single clock cycle delay to the output signal on output pin 14, inverted by an inverter 32. Flip-flop 31 produces a Q output on a line 39 and an inverted Q output. A logic NAND gate 33 combines the inverted output signal, the inverted Q output and the clock signal to produce a charge signal on a line 40. The charge signal is used to control a gate 37. Gate 37 gates VCC on line 35 to the input of an integrator, further described below. A logic NAND gate 34 combines the inverted output signal, the Q output and the clock signal to produce a discharge signal on a line 41. The discharge signal is used to control a gate 38. Gate 37 gates a reference voltage (ground) 36 to the input of the integrator described below.

The integrator includes a resistor 42, a resistor 43 a capacitor 44 and a capacitor 45. Capacitors 44 and 45 are connected to ground 36, as shown. For example, resistor 42 has a resistance of 100 kilohms. Resistor 43 has a resistance of 10 kilohms. Capacitor 44 has a capacitance of 0.01 microfarads. Capacitor 45 has a capacitance of 0.1 microfarads.

An amplifier is used to stabilize the integrated signal on line 49. The amplifier includes an operational amplifier 48 and a resistor 47. For example, resistor 47 has a resistance of 100 kilohms.

Figure 8:
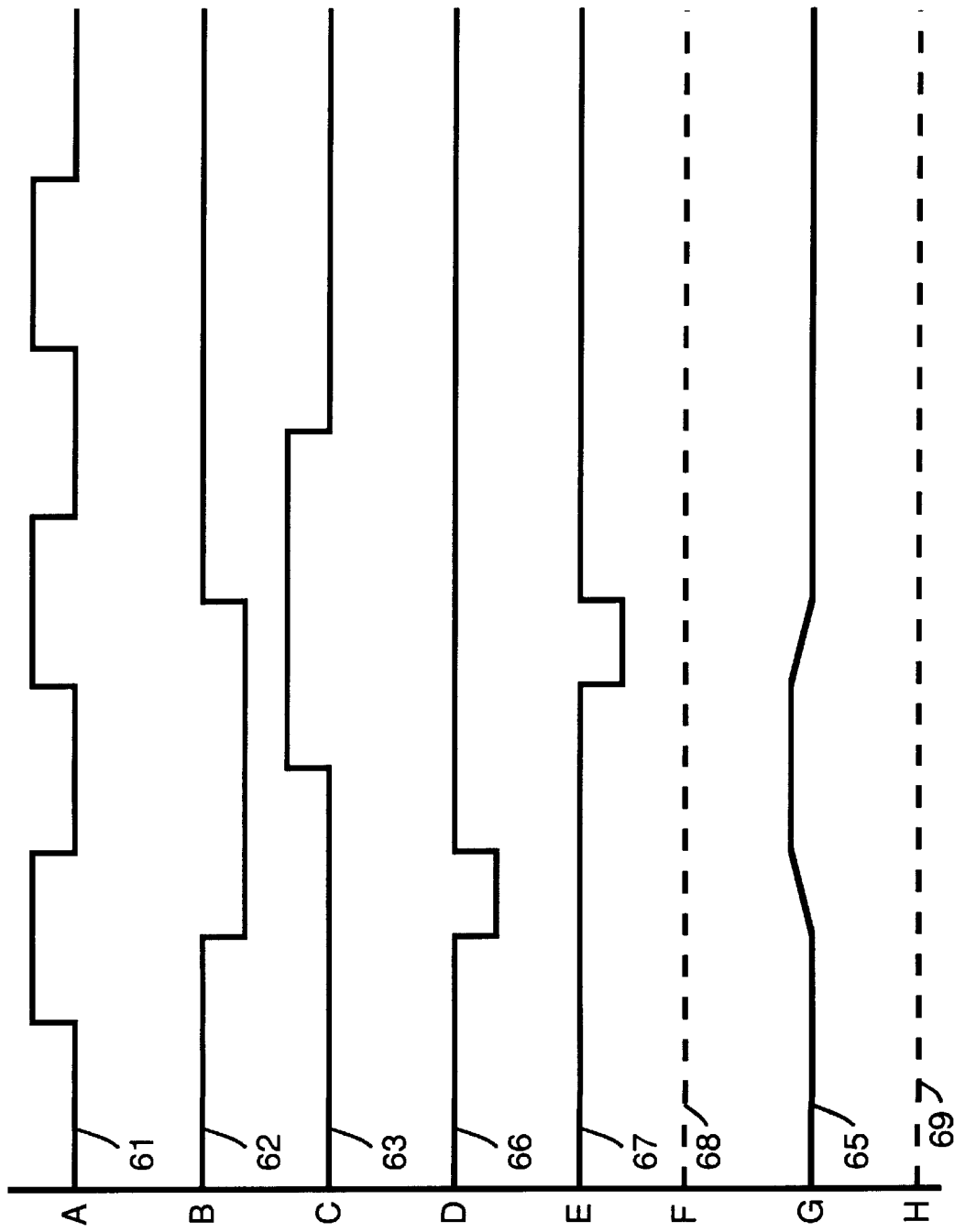
FIG. 8 shows a timing diagram for the circuitry shown in FIG. 3 in accordance with the alternate preferred embodiment of the present invention.

FIG. 8 shows a timing diagram for the circuitry shown in FIG. 3 in accordance with the preferred embodiment of the present invention. In FIG. 8, a waveform 61 shows the timing for the clock signal on clock line 13. A waveform 62 shows the timing for the output signal on output pin 14. A waveform 63 shows the timing for a Q output on line 39. A waveform 66 shows the timing for the charge signal on line 40. A waveform 67 shows the timing for the discharge signal on line 41. A waveform 65 shows the timing for the integrated signal on line 49. Waveform 65 also shows the voltage of the integrated signal on line 49 relative to VCC represented by a line 68 and ground represented by line 69.

As described above, the voltage of integrated signal on line 49 can be converted to a digital signal which is periodically read and then averaged to obtain a value which indicates the amount of delay of the output signal on output pin 14. Alternately, the amount of delay can be obtained directly from measuring the voltage value of the integrated signal on line 49. By comparing the delay set out in the manufacturers specifications for the DUT 11 with the measured delay on the output signal on output pin 14, the system margin for the integrated circuit is determined. To optimize DUT 11, the operating frequency can be increased up to a new system margin selected by the user of DUT 11.

The present invention also allows for the sensing of the core temperature of an integrated circuit by externally monitoring the phase delay of signals propagating through the integrated circuit, for example, by monitoring the change in the delay on the output signal on output pin 14. As the operating temperature rises, the phase delay will increase.

In the preferred embodiment, the value of the voltage of the integrated signal (and thus the detected phase delay of the output signal) is calibrated for each individual DUT 11. In order to do this, a thermal performance test of one or more test devices of the same type as DUT 11 is first performed. In this test, the value of the voltage of the integrated signal is detected at various operating temperatures of the test device. For example, the voltage of the integrated signal is measured when the test device is at ambient temperature, at a maximum temperature, and at several temperatures in between. This gives a continuous relationship between operating temperature of the test device and the voltage of the integrated signal for the test device. This gives a "curve" which describes the general relationship between operating temperature of the test device and the voltage of the integrated signal. The form of the "curve" is generally the same for all test devices with identical circuitry to the test integrated circuit For each new device, the value of the voltage of the integrated signal is measured under two or more operating conditions under which the operating temperature is known from the actual values measured for the test device in order to have reference points with which to "fit" to the curve determined using the test integrated circuit.

Figure 9:
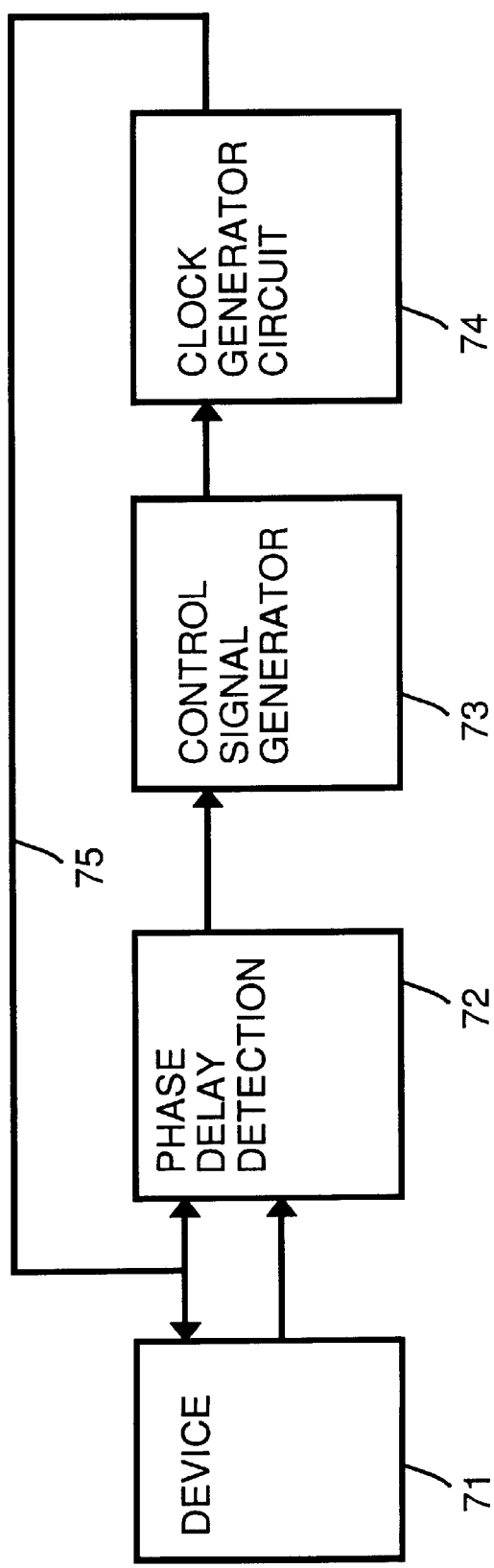
FIG. 9 is a block diagram which shows regulation of operating frequency of an integrated circuit in accordance with a preferred embodiment of the present invention.

FIG. 9 shows a block diagram of a system in which signal delay through a device 71 is measured by a phase delay detection device 72, as described above. For example, one of the implementations of delay measuring device 12 shown in FIG. 2 or FIG. 3 is used to implement phase delay detection device 72.

A clock signal on a clock line 75 is used by both device 71 and phase delay detection device 72. Phase delay detection device 72 uses the clock signal to measure an amount of delay introduced by device 71 to an output signal on an output pin. The signal generated by phase delay detection device 72 is used by a control signal generator 73 to control a switch line connected to a fast/slow line of a clock generator circuit 74. In essence, control signal generator 73 measures voltage from the output of delay detection device 72 and creates an output signal which controls clock generator circuit 74. Control signal generator 73 is implemented, for example, by a comparator with a setable threshold. For example, in the preferred embodiment, control signal generator 73 controls voltage of pin number 11 (SCLK22) of an Avasem AV9155-02 clock generator available from Integrated Circuit Systems, Inc. having a business address of 1275 Parkmoor Avenue San Jose, Calif. 95126-3448.

Clock generator circuit 74 produces a 66.6 megahertz clock when pin number 11 is asserted high, and produces a 16 megahertz clock when pin number 11 is de-asserted low. Thus when the voltage of the signal generated by phase delay detection device 72 increases above a selected threshold, clock generator circuit 74 will reduce the operating speed of the processor from 66.6 megahertz to 16 megahertz. For example, in the preferred embodiment, device 71 is a Pentium processor and the selected threshold of the voltage of the signal generated by phase delay detection device 72 is selected so that the Pentium processor will be slowed down when an increase in temperature results in the measured delay on the output signal on the output pin of device 71 increasing past an acceptable value. This will prevent the device 71 from failing as a result of temperature overheating.

The foregoing discussion discloses and describes merely exemplary methods and embodiments of the present invention. As will be understood by those familiar with the art, the invention may be embodied in other specific forms without departing from the spirit or essential characteristics thereof. Accordingly, the disclosure of the present invention is intended to be illustrative, but not limiting, of the scope of the invention, which is set forth in the following claims.

We claim:

1. A circuit for monitoring performance of an integrated circuit comprising:

a phase delay detection circuit coupled to an output pin of the integrated circuit and to a clock signal, the clock signal being used to clock circuitry within the integrated circuit, the circuitry within the integrated circuit generating an output signal on the output pin of the integrated circuit, wherein the phase delay detection circuit includes:

digital signal generating means, coupled to the output pin of the integrated circuit, for generating a digital signal, wherein changes in phase delay between the output signal on the output pin of the integrated circuit and the clock signal result in changes in a duty cycle of the digital signal generated by the digital signal generating means, wherein the digital signal generating means comprises:

a delay flip-flop having a D input, a clock input and a Q output, the clock signal being coupled to the clock input and the output signal being coupled to the D input, and a gate having a signal input, a control input and an output, the output signal on the output pin of the integrated circuit being coupled to the signal input of the gate, and the Q output being coupled to the control input of the gate; and integrating means for integrating the digital signal to produce an integrated signal, the integrated means having an input coupled to the output of the gate, wherein a voltage level of the integrated signal indicates relative phase delay between the output signal on the output pin of the integrated circuit and the clock signal.

2. A circuit as in claim 1 wherein the integrating means includes:

a resistor having a first end and a second end, the first end being coupled to the output of the gate; and, a capacitor having a first end and a second end, the first end of the capacitor being coupled to the second end of the resistor, and the second end of the capacitor being coupled to a reference voltage.

3. A circuit as in claim 2 additionally comprising:

an analog to digital converter, coupled to the first end of the capacitor.

4. A circuit as in claim 1 wherein the phase detection circuit additionally comprises:

control means, coupled to the integrating means, for changing an operating frequency of the integrated circuit when the voltage level of the integrated signal indicates that the phase delay between the output signal and the clock signal is longer than a predetermined value.

5. A circuit for monitoring performance of an integrated circuit comprising:

a phase delay detection circuit coupled to an output pin of the integrated circuit and to a clock signal, the clock signal being used to clock circuitry within the integrated circuit, the circuitry within the integrated circuit generating an output signal on the output pin of the integrated circuit, wherein the phase delay detection circuit includes:

digital signal generating means, coupled to the output pin of the integrated circuit, for generating a digital signal, wherein changes in phase delay between the output signal on the output pin of the integrated circuit and the clock signal result in changes in a duty cycle of the digital signal generated by the digital signal generating means, wherein the digital signal generating means comprises:

a delay flip-flop having a D input, a clock input, a Q output and an inverted Q output, the clock signal being coupled to the clock input and the output signal being inverted and coupled to the D input, a first NAND gate having three inputs and an output, a first input being coupled to the inverted Q output, the second input being coupled to the inverted output signal and the third input being coupled to the clock signal, a second NAND gate having three inputs and an output, a first input being coupled to the Q output, the second input being coupled to the inverted output signal and the third input being coupled to the clock signal, a first gate having a signal input, a control input and an output, a VCC voltage being coupled to the signal input of the first gate, and the output signal of the first NAND gate being coupled to the control input, and a second gate having a signal input, a control input and an output, a reference voltage being coupled to the signal input of the second gate, and the output signal of the second NAND gate being coupled to the control input of the second gate; and integrating means for integrating the digital signal to produce an integrated signal, the integrated means having an input coupled to the output of the first gate and to the output of the second gate, wherein a voltage level of the integrated signal indicates relative phase delay between the output signal on the output pin of the integrated circuit and the clock signal.

6. A circuit as in claim 5 wherein the integrating means includes:

a first resistor having a first end and a second end, the first end being coupled to the output of the first gate;

a second resistor having a first end and a second end, the first end of the second resistor being coupled to the second end of the first resistor;

a first capacitor having a first end and a second end, the first end of the first capacitor being coupled to the second end of the first resistor, and the second end of the first capacitor being coupled to the reference voltage; and a second capacitor having a first end and a second end, the first end of the second capacitor being coupled to the second end of the second resistor, and the second end of the second capacitor being coupled to the reference voltage.

7. A circuit as in claim 6 wherein the phase detection circuit additionally comprises:

an operational amplifier, having a first input, a second input and an output, the first input of the operational amplifier being coupled to the second end of the second resistor, and the second input of the operation amplifier being coupled to the reference voltage; and, a third resistor, coupled between the first input of the operational amplifier and the output of the operational amplifier.

8. A circuit as in claim 5 wherein the phase detection circuit additionally comprises:

control means, coupled to the integrating means, for changing an operating frequency of the integrated circuit when the voltage level of the integrated signal indicates that the phase delay between the output signal and the clock signal is longer than a predetermined value.

9. A system comprising:

an integrated circuit, the integrated circuit using a clock signal to generate an output signal on an output pin of the integrated circuit; and, a monitoring circuit which monitors core temperature of the integrated circuit, the monitoring circuit comprising a phase delay detection circuit coupled to the output pin of the integrated circuit and to the clock signal, the phase delay detection circuit including digital signal generating means, coupled to the output pin of the integrated circuit, for generating a digital signal, wherein changes in phase delay between the output signal on the output pin of the integrated circuit and the clock signal result in changes in a duty cycle of the digital signal generated by the digital signal generating means, and integrating means, coupled to the digital signal generating means, for integrating the digital signal to produce an integrated signal, a voltage level of the integrated signal indicating relative phase delay between the output signal on the output pin of the integrated circuit and the clock signal, and control means, coupled to the integrating means, for changing an operating frequency of the integrated circuit when the voltage level of the integrated signal indicates that the phase delay between the output signal and the clock signal is longer than a predetermined value.

10. A method for monitoring performance of an integrated circuit comprising the following steps:

(a) externally monitoring core temperature of the integrated circuit, comprising the following substeps (a.1) placing the integrated circuit in a known state; and, (a.2) detecting changes in phase delay between an output signal on an output pin of the integrated circuit and a clock signal to determine the core temperature of the integrated circuit, wherein the clock signal is used to clock circuitry, within the integrated circuit, which generates the output signal; and (b) lowering an operating frequency of the integrated circuit when the changes detected in substep (a.2) indicate that the phase delay between the output signal and the clock signal is longer than a predetermined value.

11. A method as in claim 10 wherein substep (a.2) includes the following substeps:

(a.2.1) producing a digital signal with a duty cycle which reflects the phase delay between the output signal and the clock signal; and, (a.2.2) integrating the duty cycle of the digital signal to produce an integrated signal with a voltage which indicates phase delay between the output signal and the clock signal.

12. A method as in claim 11 wherein step (a.2) additionally includes the following substep:

(a.2.3) converting the voltage of the integrated signal to produce a digital indication.

13. A method comprising the following step:

(a) monitoring core temperature of an integrated circuit, including the following substeps, (a.1) comparing phase delay between an output signal on an output pin of the integrated circuit and a clock signal used by the integrated circuit in generating the output signal, (a.2) generating a digital signal in response to the comparison made in substep (a.1), a duty cycle of the digital signal indicating phase delay between the output signal and the clock signal, and (a.3) integrating the digital signal to produce an integrated signal, the integrated signal having a voltage level which indicates core temperature of the integrated circuit; and, (b) lowering an operating frequency of the integrated circuit when the voltage level of the integrated signal indicates that the phase delay between the output signal and the clock signal is longer than a predetermined value.

14. A method as in claim 13 additionally comprising the following step:

(c) converting the voltage of the integrated signal to produce a digital indication of the core temperature.

* * * * *